(12) United States Patent
Nystrom et al.

(10) Patent No.: US 7,838,321 B2
(45) Date of Patent: Nov. 23, 2010

(54) MULTIPLE STAGE MEMS RELEASE FOR ISOLATION OF SIMILAR MATERIALS

(75) Inventors: Peter J. Nystrom, Webster, NY (US); Nancy Jia, Webster, NY (US); Kee Ryu, Urbana, IL (US)

(73) Assignee: Xerox Corporation, Norwalk, CT (US)

( * ) Notice: Subject to any disclaimer, the term of this patent is extended or adjusted under 35 U.S.C. 154(b) by 589 days.

(21) Appl. No.: 11/312,619

(22) Filed: Dec. 20, 2005

(65) Prior Publication Data

US 2007/0138582 A1   Jun. 21, 2007

(51) Int. Cl.
*H01L 21/00* (2006.01)
(52) U.S. Cl. .................. 438/53; 257/E21.251
(58) Field of Classification Search .......... 438/53; 257/E21.251
See application file for complete search history.

(56) References Cited

U.S. PATENT DOCUMENTS

| | | | | |
|---|---|---|---|---|
| 5,808,331 A * | 9/1998 | Zhang et al. | ................ | 257/254 |
| 6,146,543 A * | 11/2000 | Tai et al. | ................ | 216/2 |
| 2003/0058069 A1* | 3/2003 | Schwartz et al. | ............... | 335/78 |
| 2003/0138986 A1* | 7/2003 | Bruner | ................ | 438/52 |
| 2003/0153116 A1* | 8/2003 | Carley et al. | ................ | 438/53 |
| 2004/0147132 A1* | 7/2004 | Nam et al. | ................ | 438/720 |

* cited by examiner

*Primary Examiner*—Steven J Fulk
(74) *Attorney, Agent, or Firm*—Prass LLP

(57) ABSTRACT

This describes a starting structure and method for forming a micro-mechanical device. These devices have several uses in both government and commercial applications. The starting structure can be sold or supplied to others who will then make a final product, or it can be used directly to make a final product. An appropriate use of this starting structure is to make deformable devices useful in an inkjet printing device.

5 Claims, 3 Drawing Sheets

MULTIPLE STAGE MEMS RELEASE FOR ISOLATION OF SIMILAR MATERIALS

This application relates to MEMS (Micro Electro Mechanical Systems) technology and, more specifically, to structures and methods to produce micro mechanical devices.

BACKGROUND

MEMS technology includes the structures and processes for making electromechanical devices with parts on the order of microns ($10^{-6}$ meters) in size, typically made out of silicon using standard fabrication equipment. MEMS is used frequently in defense applications, but it is becoming increasingly popular for use in sensors, industrial and residential controls, electronic components, computer peripherals, automotive and aerospace electronics, analytical instruments, and office equipment. While this disclosure will be referred generally to office equipment and inkjet technology, it is understood that the embodiments discussed herein can be used in any suitable area utilizing MEMS. Products of MEMS offer significant advantages such as collocation of sensing, actuation, computation, communication and power. Useful in producing products of small size, low mass/inertia, high speed/resonant frequency and good shock resistance. Also useful in control phenomena such as chemical reactions on a micro scale. Further uses of MEMS are in inexpensive manufacture of products where mass production is desired. Using MEMS to produce actuators consideration is given to parallel-plate drive devices that provide a relatively large force in a small space, and requires low power. Parallel plate drive actuators are useful in the production of inkjet devices where one plate bends instead of translating.

In forming surface micromachined micro-electro-mechanical layered devices, frequent problems may be encountered using MEMS. Typical MEMS release operations remove one sacrificial layer to create moveable structures. In order to do this accurately, the materials used must exhibit strong etch selectivity to prevent undesired outcome. The restrictions constrain the materials used, the complexity of the device, and may prevent certain combinations from being used effectively. This can present design and manufacturing issues by requiring additional layers to protect areas that would otherwise be damaged during this release. Other solutions to this problem include using esoteric materials that are not widely available, are proprietary, and are not compatible with some fabrication methods and equipment.

SUMMARY

MEMS devices depend heavily on the ability to form structures by selective patterning and etching combined with processes that can release these structures so they can move. In a present embodiment one would use a multiple stage release process that begins by removing the first sacrificial layer exposing a second sacrificial layer. This second layer protects an underlying structure that has nearly identical properties to the first sacrificial layer and would normally be damaged without it. Once the primary etch is complete, a second etchant is used to remove the second sacrificial layer. Without the secondary protection, this remaining underlying layer would be destroyed (consumed) during the first release etch. This allows the construction of a device where unique materials are exposed that would otherwise be impossible. After completion, the remaining structure is ready for subsequent use or further processing.

Previously used processes and beginning structures used in making micro-mechanical devices in several instances have caused some difficulties. In the manufacturing of heads used in MEMS inkjet devices, several layered micro-mechanical devices are used to prepare a chip. Subsequently, a plurality of chips can be used to form a print head. The embodiments herein described will deal with the structures and processes used in making these micro-mechanical devices.

In a specific embodiment of a starting structure one would start with a silicon wafer in layer 2 (as shown in drawings together with other numbered layers). To form layer 3, one would grow a thermal Oxide ($SiO_2$) on the top surface of layer 2. A Polysilicon (Si) layer 4 would be deposited on layer 3, and an Oxide ($SiO_2$) is formed as layer 5 on top of layer 4. These above layers 2-5 constitute the underlying layer of this starting structure. A protective layer 6 of Nitride ($Si_3N_4$) is deposited over layer 5 and is the second sacrificial layer. A layer 7 of Oxide ($SiO_2$) is placed over layer 5. Layer 7 is a first sacrificial layer that will be removed in the etching process and with layer 6 forms a gap in the final product. The gap is needed to allow the membrane to move through its range of motion when used with layer 8, which is a deformable Polysilicon membrane that is placed over layer 7. In addition to or in lieu of a deformable membrane, a beam, a moving plate or any other MEMS structure can be used in embodiments of this invention. "Deformable" or "deformable layer" will include membranes, beams and moving plates. This deformation is required, for example, when the final micro mechanical device is used in making a head for inkjet ejection. In this embodiment, a starting structure includes underlying layers that are intended to be kept in the final product, however, they have similar etching properties with a sacrificial layer. In these etch selectivity situations, this present embodiment places a second sacrificial layer (for example, Silicon Nitride) to protect the desired underlying layers comprising Oxides, Polysilicon, and a Silicon wafer. The Nitride layer is resistant to a HF etch which is used to remove the first sacrificial layer. Later, the Nitride is then removed by a hot Phosphoric Acid etch, which leaves the desired underlying structure intact.

A method in an embodiment of the present invention that is used for the formation of a micro-mechanical device useful in an inkjet printing device is as follows. This method comprises providing a starting structure comprising in an operative arrangement, a deformable upper polysilicon layer (as 8 in FIG. 1), an underlying layer(s), a first sacrificial Oxide layer and a second sacrificial Nitride layer. An etching process is used on this starting structure whereby the first sacrificial layer is removed by a Hydrofluoric Acid (HF) initial etch, thereby leaving the second Nitride sacrificial layer and underlying layer(s) intact. Subsequently, the second (Nitride) sacrificial layer is removed by a hot Phosphoric Acid etch to provide a deformable micro-mechanical device having an air gap(s) left by the removal of the first and second sacrificial layers. The first sacrificial layer in an embodiment comprises $SiO_2$ and the second sacrificial layer comprises $Si_3N_4$. A release hole is provided in and through the upper deformable Polysilicon layer; see FIG. 1 for location of layers above described in this paragraph and other above and below paragraphs.

While the above embodiment comprises the use of a specific starting layered structure, the concept obviously can be used in other applications. The basic concept involves a starting layered structure for producing a micro-mechanical device that comprises a desired underlying layer. There is in this layered structure first and second sacrificial layers. The first sacrificial layer has similar material etching properties with the desired underlying layer(s). The second sacrificial layer has sufficiently different etching properties from the desired underlying layer(s). This second sacrificial layer is resistant to the material used to remove the first sacrificial layer. Also, this second sacrificial layer will protect the underlying layer(s) when the first sacrificial layer is removed.

Typical starting structures in an embodiment will have layers of about 5 microns down to a few tens of angstroms. Note that these thicknesses refer to the applied or deposited layers, the beginning wafer layer 2 is typically much thicker, on the order of 600 microns. The resulting products will also have layer thicknesses of about 5 microns down to a few tens of angstroms. The specified thicknesses are typical and are not restricted to this range, they only serve to illustrate the concept. Any material(s) capable of being deposited in any form, patterned by any means, etched by any means to leave desired structures with desired properties may be used in the embodiments herein disclosed. A key to the embodiments herein described is that a multiple stage release process and starting structure be used that begins by removing a first sacrificial layer exposing a second sacrificial layer. This second sacrificial layer protects an underlying structure that has nearly identical etching properties to the first sacrificial layer. This underlying layer(s) would normally be damaged during release if not for the second protective sacrificial layer. Obviously any suitable layers or materials may be used within the scope of embodiments herein described including single crystal, amorphous and polycrystalline silicons, silicon dioxides (all forms PSG, thermal, BPSG, TEOS, SRSG, spin on glass (SOG)), silicon nitrides, carbides, oxynitrides, zinc oxides, suitable metals, metal oxides, nitrides, polymers and glasses. In other words, any set of materials that meets the selectivity relationship in a sufficient manner.

By using the starting layered structure of the present embodiment, a final micro-electro-mechanical device useful in inkjet systems is made at a low cost, provides use in high density and high speed applications, and is more adaptable to handle a variety of different viscosity inks.

In general, the ability to process devices in this manner will simplify device design and fabrication. Many creative structures can be made and replicating and/or scaling the process to manufacturing volumes requires standardized, high yield methods.

For the purposes of explanation, one specific example of this type of processing is illustrated here and in the drawings. For the MEMS jet printing device, an electrostatic membrane is fabricated using surface micromachining techniques. The device consists of an electrically isolated electrode that attracts a moveable membrane upon application of an actuation potential. When the actuator is released, it would act upon an ink volume that is compressed releasing a droplet onto a printing media. Depending on device dimensions, the actuation potential can be quite high resulting in very large electric fields. These high fields necessitate careful design of the dielectric stack surrounding the electrode to minimize charge injection and leakage currents and prevent catastrophic breakdowns and inadvertent conduction. Silicon is the fundamental building block of such a device, while the sacrificial release material is Silicon Dioxide (glass or simply Oxide). The two materials are widely separated in etch selectivity and the preferred release etchant is Hydrofluoric Acid (HF) which readily dissolves Oxide leaving the Silicon intact.

The high electric field requirements in this application require an additional dielectric layer protection on top of the polysilicon actuation electrode. Due to the nature of the release, this needs to be formed in two layers with the desired Oxide covered by Silicon Nitride (Nitride) which is resistant to an HF etch. It is not possible to simply eliminate this second protective layer as it must be present to protect the underlying Oxide. Without the Nitride, the Oxide dielectric would be consumed along with the sacrificial Oxide during the release etch.

One would continue the release etch after the HF processing to include additional chemistry that removes only the Nitride, but leaves the dielectric Oxide intact upon the actuation electrode. In this case, a hot Phosphoric Acid etch is used targeting the Nitride and removing it. The drawings show the resulting structure with only the ideal isolation Oxide encapsulating the actuation electrode in the membrane cavity.

Integration of this additional etch step is relatively easy. Normally, after a single step etch, the device structure undergoes a series of rinses in DI water and Methanol. Afterwards, great care is taken during drying the devices to prevent stiction. This normally includes a controlled bake or a more specialized Critical Point Drying technique. The proposed etch step would be added to the sequence of wet processing following the HF etch, but preceding the final rinses and drying. Note that some preparatory rinses are required between the two acid etches for safety and cross-contamination prevention.

Within the general present concept, this process method includes using an entirely different sacrificial release material. First, the material has to be chosen such that its release chemistry does not affect the materials that must remain (etch selectivity). Next, the material must be able to survive microelectronic processing methods, possibly including very high temperature anneals (900 degrees C. or more) and aggressive chemical processing. Additional requirements that impact this choice include potential contamination of process equipment, safety of materials and etchants, and cost of processing. All of these factors are considered by production fabs and can severely limit the availability of this option in processing. One of the most encountered conflicts is contamination of process equipment. Many candidate materials, when exposed to subsequent processing, can contaminate process equipment creating yield fallout and other serious issues.

In this specific above defined embodiment, the Nitride is specifically intended to protect the isolation Oxide during the sacrificial Oxide release etch. While in many cases leaving the Nitride in place would be acceptable, in this case it is not. Nitride is a good physical barrier, but not a good dielectric. It is prone to breakdown, leakage current and charging effects. A typical nitride has a breakdown field of 3-4 MV/cm. while a good thermal oxide has a breakdown field of 10 MV/cm. Nitride also traps orders of magnitude more charge than Oxide. It has also been shown to be prone to stiction. As a dielectric, pure Oxide alone is superior, but conventional release etch methods prevent an easy way to allow this type of material to remain.

These issues and hurdles are what lends an advantage to this approach. Only traditional materials are used in the processing allowing flexibility in the design and fabrication of the devices. This allows freedom of choice, both in the design and in the selection of the manufacturing fab.

Advantages:
1. Standard Silicon micromachining design and processing
2. Retain industry "standard" HF release
3. Allows a final exposed Oxide surface within the device
4. No specialty processing or etching This approach is not limited to the application described nor the materials suggested. Certainly, the cost advantages lie in the efficient choice of materials, but it can be easily applied to alternate materials. Note that the advantages may diminish as the materials become more exotic and less mainstream, but the concept remains the same. A key is using a set of materials that have the proper etching relationships between them. This starting structure can be used directly to form a micro-mechanical device, or the starting structure can be packaged and sold or supplied to others to be used by them in the formation of a desired final micro-mechanical product.

DETAILED DESCRIPTION OF DRAWINGS AND PREFERRED EMBODIMENTS

Figure 1:
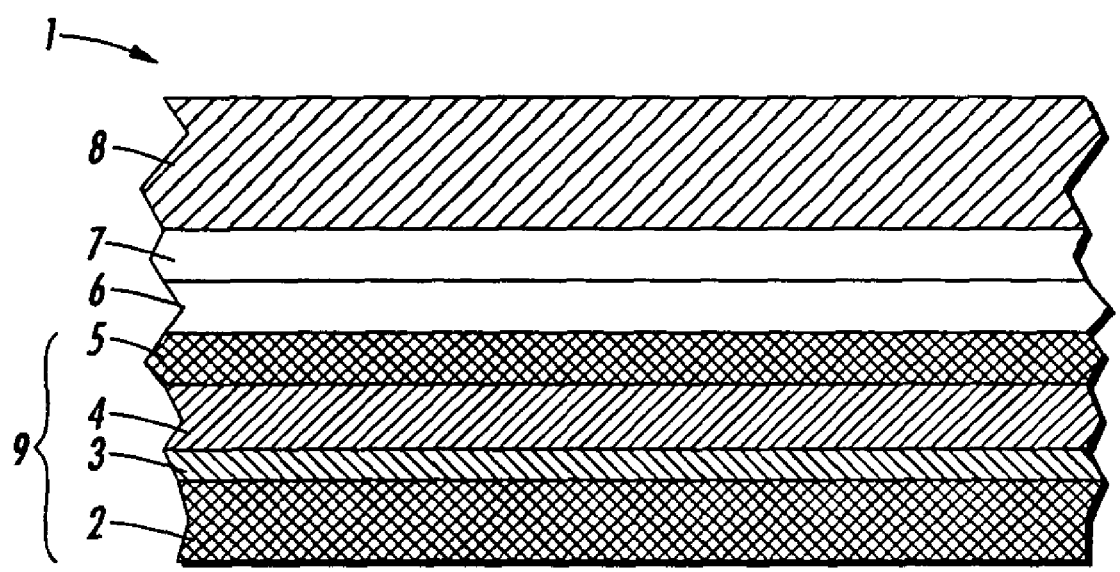
FIG. 1 illustrates the layered formation of an embodiment of the starting structure described herein.

In FIG. 1 a starting structure 1 useful in manufacturing a micro-mechanical device using MEMS technology is illustrated. While specifics of embodiments will be described herein with reference to a starting structure 1 useful in making a deformable membrane (in an electric field) for ink drop ejection, it is to be understood that similar starting structures may be used to make other final products; only the specific materials used in each layer may be substituted for the specific materials in layers 2-8. In any situation where a gap is needed in a final product, and two sacrificial layers are needed to create this gap, the starting structure 1 may be used with substitute materials for non-sacrificial layer. In FIG. 1 a Silicon wafer layer 2 is used as a base wafer. A thermal Oxide $SiO_2$ layer 3 is positioned above layer 2. Layer 4 is a Polysilicon (Si) layer and layer 5 is a $SiO_2$ layer. Layers 2-5 make up an underlying layered structure 9 that is to be protected during an etching process. Layer 3 (thermal Oxide) acts as a dielectric material and layer 4 Polysilicon (Si) acts as a conductor. Layer 5 underlying Oxide $SiO_2$ also acts as a dielectric layer that is protected together as part of underlying layers 9 by layer 6 ($Si_3N_4$) during an etching process. Layer 6 is a sacrificial layer and has widely separated material etching properties from the underlying layer whereas layer 7 is a first sacrificial layer having similar material etching properties with said desired underlying layer 9. Layer 8 is a flexible or deformable Polysilicon layer that will deform in the presence of an electric field when the final product 12 is used. Therefore, when the first sacrificial layer 7 is removed by etching (via release hole 11), the second sacrificial layer 6 ($Si_3N_4$) protects the underlying layers 9 leaving layers 9 intact. The Nitride layer 6 is resistant to HF etch used to remove the first sacrificial layer 7. This Nitride layer 6 is specifically intended to protect the Oxide layer 5 during the sacrificial Oxide release etch. The second sacrificial Nitride layer 6 is then removed using a hot Phosphoric Acid etch that does not affect the dielectric Oxide layer 5, nor layers 4, 3 and 2. This leaves the desired underlying composite layer 9 intact for use in the final product which will be a deformable membrane for ink drop ejection. The removal of first and second sacrificial layers 6 and 7 leaves a gap or space 10 (see FIG. 2) that provides room for the flexibility or deformability of layer 8 to final product.

Figure 2A:
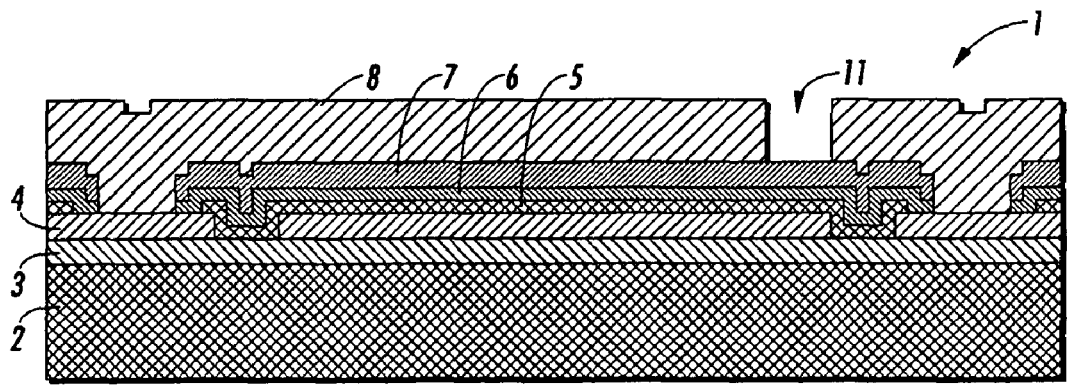
FIG. 2 illustrates the sequence of steps in forming a final micro-mechanical device using MEMS technology and a starting structure defined herein.
Figure 2B:
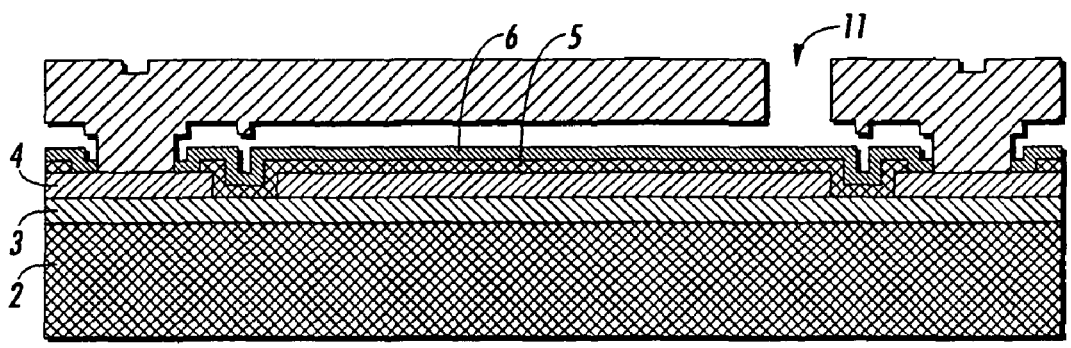
Figure 2C:
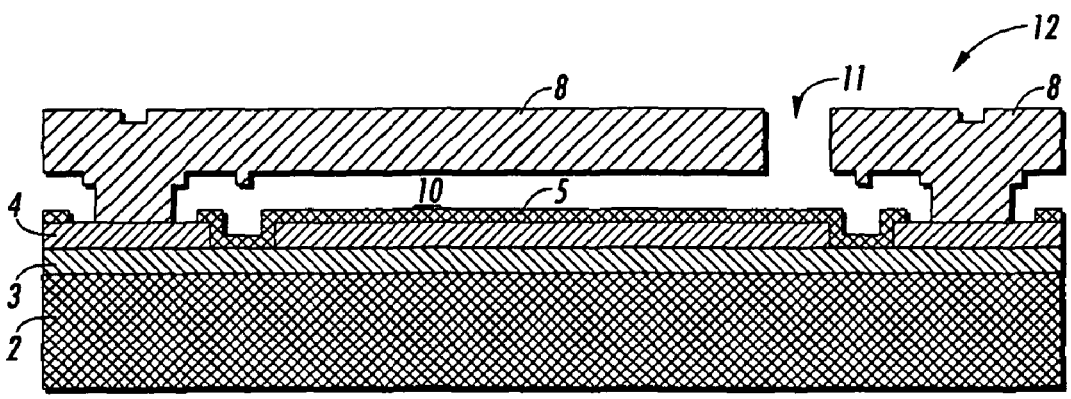

In FIG. 2, a sequential step process is illustrated using the starting structure 2 defined herein for making in an example a MEMS jet printing device where an electrostatic membrane is fabricated using surface micromachining techniques. This device consists of an electrically isolated electrode that attracts a movable membrane upon application of an actuation potential. When the actuator is released, it will act upon an ink volume that is compressed releasing an ink droplet onto a printing media. FIG. 2 illustrates the steps using starting structure 1 herein defined. The starting structure 1 has the layers above defined in FIG. 1 and includes a release hole 11 that will permit passage of the release etchants (such as HF and Phosphoric Acid) described above. FIG. 2A illustrates the starting structure 1 in an initial state before etching. FIG. 2B illustrates the structure after the first sacrificial layer 7 is removed by an HF etch, leaving a space 10 where the layer 7 was before the etch. FIG. 2C illustrates the final product 12 after the second sacrificial layer has been removed by a hot Phosphoric Acid etch. Final layers 2-5 make up the desired underlying composite layer 9.

Figure 3:
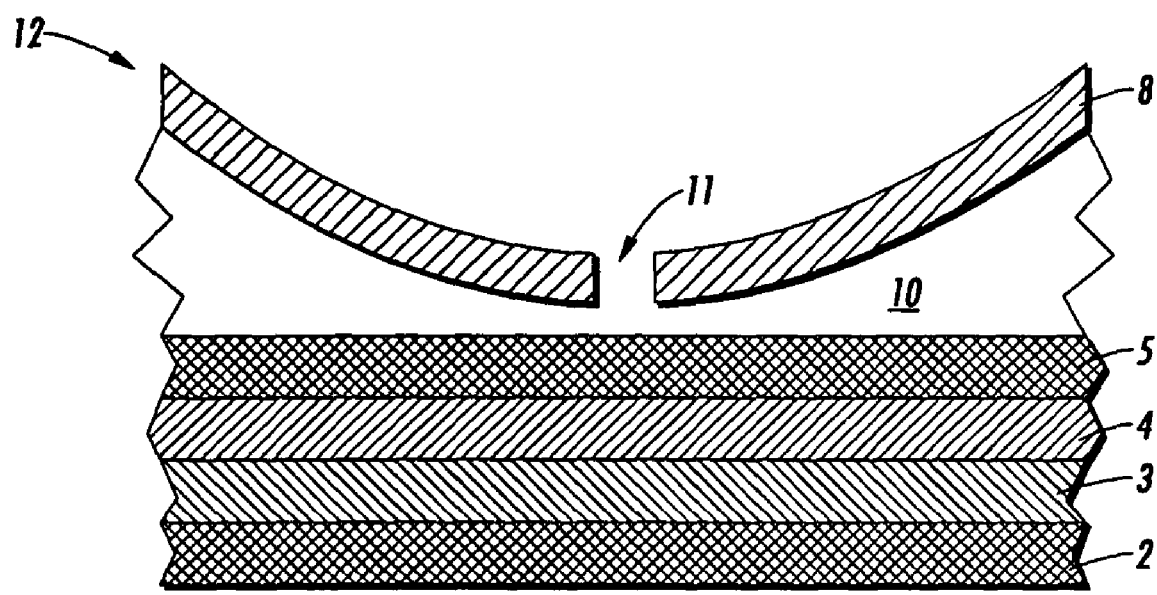
FIG. 3 illustrates a structure having a deformable upper Polysilicon layer made in MEMS technology from an embodiment of a starting structure herein defined in FIG. 1.

FIG. 3 illustrates the final product 12 when the Polysilicon layer 8 is deformed in the presence of an electric field. Gap 10 is formed by the removal of sacrificial layers 6 and 7 which permits layer 8 in the final product flexibility when it is deformed to emit an inkjet droplet through the ink chamber located above layer 8.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. A method for forming a deformable micro-mechanical device useful in an inkjet printing device, said method comprising:
    providing a starting structure comprising an upper deformable polysilicon layer with a release hole there through, said release hole extending from through said upper deformable polysilicon layer to a first sacrificial oxide layer,
    underlying layers,
    positioning said first sacrificial oxide layer and a second sacrificial nitride layer,
    etching said starting structure whereby said first sacrificial oxide layer is removed by a hydrofluoric (HF) initial etch, thereby leaving said second nitride sacrificial layer and said underlying layers intact,
    subsequently, said second (nitride) sacrificial layer is removed by a phosphoric acid etch to provide a final deformable micro-mechanical device,
    providing thereby said final deformable micro-mechanical device having an upper deformable polysilicon layer with a release hole therein and an air gap below said upper deformable layer, and below said gap are positioned said underlying layers.

2. The method of claim 1 wherein said underlying layers comprise from top down from below said gap, a $SiO_2$ dielectric layer, a conductive polysilicon layer, a thermal $SiO_2$ layer, and a base silicon layer.

3. The method of claim 1 wherein said air gap is left by the removal of said first and second sacrificial layers.

4. The method of claim 1 where said first sacrificial layer comprises $SiO_2$ and said second sacrificial layer comprises $Si_3N_4$.

5. The method of claim 1 wherein said first sacrificial layer has similar material etching properties with said underlying layers, and said second sacrificial layer has different etching properties from said underlying layers.

* * * * *